United States Patent
Bauer et al.

(10) Patent No.: US 7,312,631 B1
(45) Date of Patent: Dec. 25, 2007

(54) STRUCTURES AND METHODS FOR AVOIDING HOLD TIME VIOLATIONS IN A PROGRAMMABLE LOGIC DEVICE

(75) Inventors: Trevor J. Bauer, Boulder, CO (US); Ramakrishna K. Tanikella, Boulder, CO (US); Steven P. Young, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 112 days.

(21) Appl. No.: 11/264,405

(22) Filed: Nov. 1, 2005

(51) Int. Cl.
*H03K 19/177* (2006.01)
*H03K 19/173* (2006.01)
*H03K 19/00* (2006.01)

(52) U.S. Cl. ............ 326/38; 326/39; 326/41; 326/47; 326/101

(58) Field of Classification Search ............ 326/37–41, 326/47, 101
See application file for complete search history.

(56) References Cited

U.S. PATENT DOCUMENTS

| | | | | |
|---|---|---|---|---|
| 4,931,671 A * | 6/1990 | Agrawal | ............ | 326/40 |
| 5,914,616 A * | 6/1999 | Young et al. | ............ | 326/41 |
| 5,942,913 A * | 8/1999 | Young et al. | ............ | 326/41 |
| 5,963,050 A * | 10/1999 | Young et al. | ............ | 326/41 |
| 6,107,827 A * | 8/2000 | Young et al. | ............ | 326/41 |
| 6,204,689 B1 * | 3/2001 | Percey et al. | ............ | 326/41 |
| 6,204,690 B1 * | 3/2001 | Young et al. | ............ | 326/41 |
| 6,292,022 B2 * | 9/2001 | Young et al. | ............ | 326/41 |
| 6,448,808 B2 * | 9/2002 | Young et al. | ............ | 326/41 |
| 7,068,072 B2 * | 6/2006 | New et al. | ............ | 326/47 |
| 2001/0007428 A1 * | 7/2001 | Young et al. | ............ | 326/41 |

OTHER PUBLICATIONS

Xilinx, Inc., "The Programmable Logic Data Book", 1996, Published Jul. 1996; available from Xilinx, Inc., 2100 Logic Drive, San Jose, California 95124, p. 4-26.

* cited by examiner

*Primary Examiner*—Rexford Barnie
*Assistant Examiner*—Thienvu Tran
(74) *Attorney, Agent, or Firm*—Lois D. Cartier

(57) ABSTRACT

Structures and methods of avoiding hold time violations in a design implemented in a PLD. In a programmable device, the delay of a signal path varies, e.g., depending on the separation between the source and destination of the signal. An optional delay element is provided between a programmable interconnect structure and a destination logic element having a clock skew relative to the source. The optional delay element is programmed by the implementation software to introduce a delay on the signal path when necessary to meet the hold time requirements for the destination logic element. The optional delay is designed to be large enough to overcome hold-time violations even for the largest possible clock skew and the smallest possible signal delay. When no hold time violation occurs, the optional delay element is configured to bypass the additional delay, to avoid imposing a large setup requirement on the signal.

8 Claims, 9 Drawing Sheets

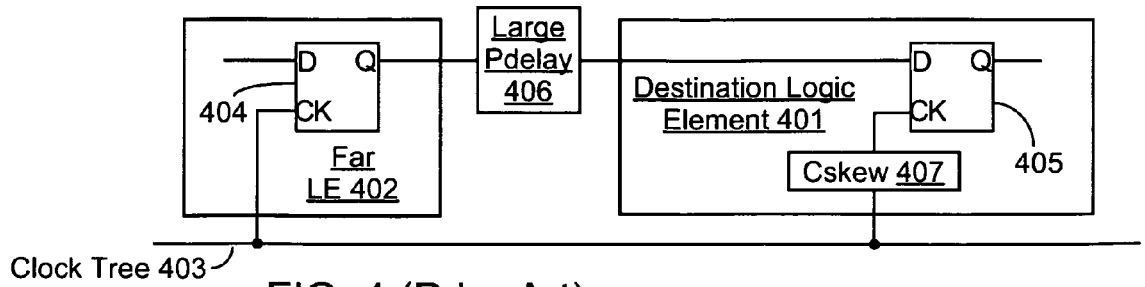
FIG. 4 (Prior Art): No Hold Time Violation
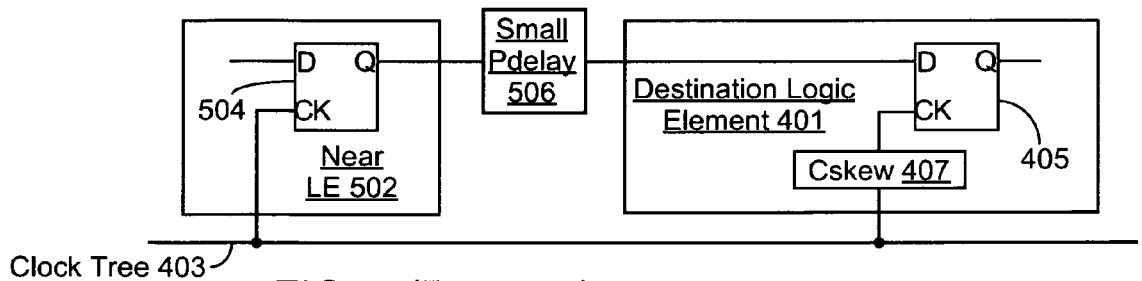
FIG. 5 (Prior Art): Hold Time Violation
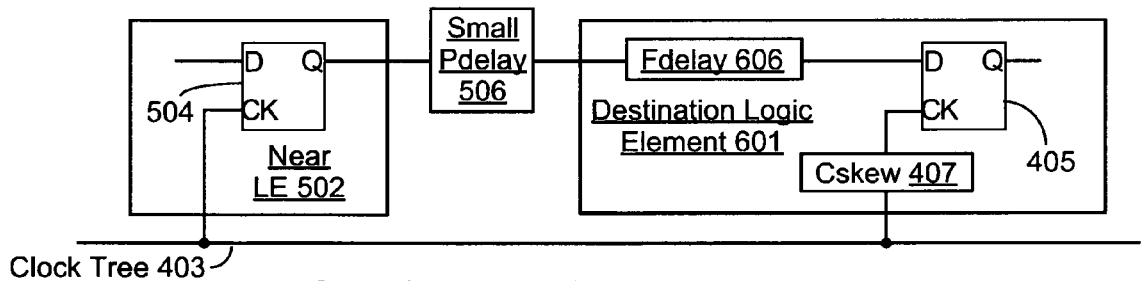
FIG. 6 (Prior Art): No Hold Time Violation
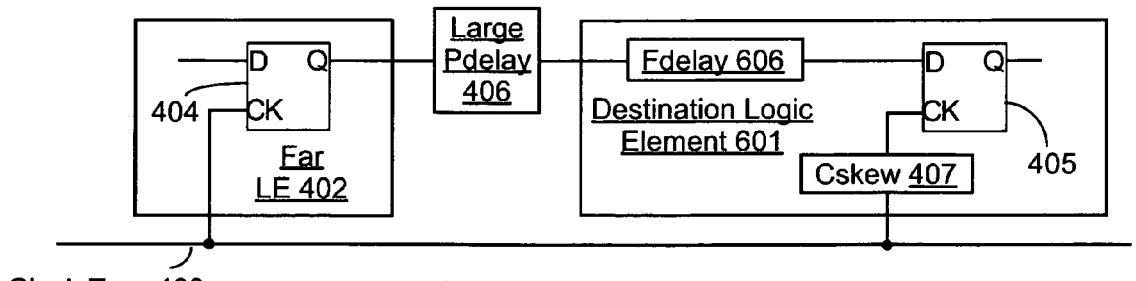
FIG. 7 (Prior Art): Large Setup Time

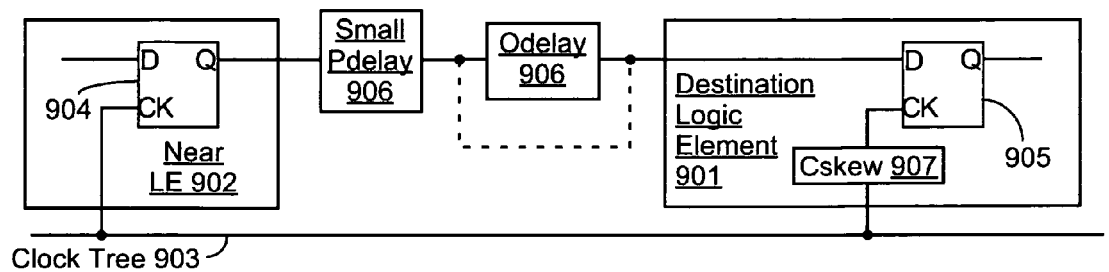
FIG. 9: Insert Delay, No Hold Time Violation
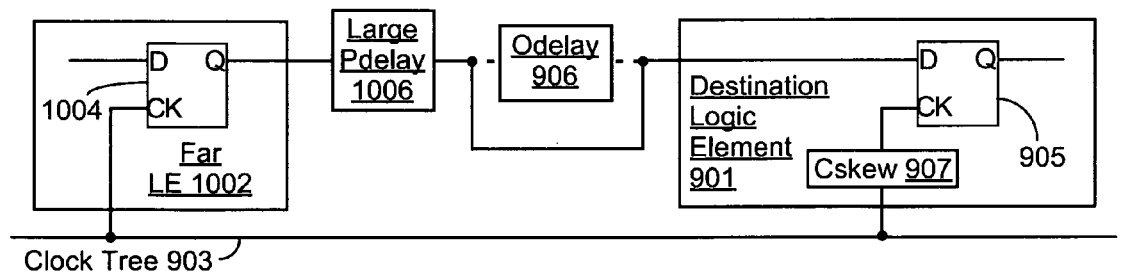
FIG. 10: Bypass Delay, No Large Setup Time

STRUCTURES AND METHODS FOR AVOIDING HOLD TIME VIOLATIONS IN A PROGRAMMABLE LOGIC DEVICE

FIELD OF THE INVENTION

The invention relates to programmable logic devices (PLDs). More particularly, the invention relates to methods and structures for avoiding hold time violations in a programmable logic device by utilizing optional delay elements.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Ideally, a PLD can be programmed to implement a wide variety of designs. However, a PLD architecture optimized for one type of design might not function as well for a different type of design. Therefore, it is desirable to provide a PLD that remains flexible enough to implement a wide variety of designs while not unduly sacrificing performance.

SUMMARY OF THE INVENTION

The invention provides structures and methods by which hold time violations in a design implemented in a PLD can be corrected by the implementation software for the PLD, while maintaining a high clock frequency on its critical paths. In a programmable device, the delay of a signal path from a source to a destination logic element varies, depending, for example, on the separation between the source and destination logic elements. In some embodiments, the destination logic element has a clock skew relative to other logic elements in the PLD. Therefore, according to the present invention, an optional delay element is provided between a programmable interconnect structure and a destination logic element. The optional delay element can be programmed by the implementation software to introduce a delay on the signal path when necessary to meet the hold time requirements for the destination logic element. The optional delay can be designed to be large enough to overcome hold-time violations even for the largest possible clock skew and the smallest possible signal delay.

When the path delay on the signal path is smaller than the clock skew, such that a hold time violation occurs, the implementation software configures the optional delay element to insert the optional delay on the signal path, thereby overcoming the hold time violation. When the path delay is greater than the clock skew, such that no hold time violation occurs, the optional delay element is configured to bypass the additional delay, to avoid imposing a large setup requirement on the signal.

According to one embodiment, an integrated circuit (IC) includes a programmable interconnect structure, input multiplexers having input terminals coupled to the programmable interconnect structure, a first logic element having an output terminal coupled to the programmable interconnect structure, and optional delay elements. Each of the optional delay elements has an input terminal coupled to the output terminal of a corresponding input multiplexer, and an output terminal coupled to a corresponding input terminal of the first logic element. In some embodiments, the first logic element comprises a clock skew relative to other logic elements in the IC, and each of the optional delay elements comprises an optional delay sufficiently large to overcome a hold-time violation caused by the clock skew.

According to another embodiment, a method of avoiding hold time violations in a PLD includes assigning a source logic element to drive a signal onto a programmable interconnect structure of the PLD, and assigning a destination logic element to receive the signal from the programmable interconnect structure. The destination logic element includes a clock skew relative to the source logic element. A signal path is implemented between the source and destination logic elements, using the programmable interconnect structure. Implementing the signal path includes configuring an optional delay element to bypass an optional delay. The implemented signal path is then checked for a hold time violation. If a hold time violation is found, the optional delay element is configured to insert the optional delay, thus overcoming the hold time violation.

According to yet another embodiment, a method of implementing a user design in a PLD while avoiding hold time violations includes: implementing the user design, including configuring an optional delay element to insert an optional delay into each signal path in the design; determining the critical paths in the implemented user design; and reconfiguring the delay elements in each of the critical paths to bypass the optional delay. In some embodiments, for at least one signal path, the destination logic element comprises a clock skew relative to the source logic element, and the optional delay on the signal path includes a delay sufficiently large to overcome a hold time violation for a maximum value of the clock skew and a minimum delay in the signal path.

BRIEF DESCRIPTION OF THE DRAWINGS

The present invention is illustrated by way of example, and not by way of limitation, in the following figures.

FIG. 4 illustrates a typical interconnection between widely spaced logic elements in a known FPGA.

FIG. 5 illustrates a typical interconnection between near logic elements in the known FPGA of FIG. 4, where the interconnection results in a hold time violation.

FIG. 6 illustrates how the hold time violation of FIG. 5 can be avoided by adding an additional fixed delay to the destination logic element.

FIG. 7 illustrates how the additional fixed delay of FIG. 6 can cause a large setup requirement for an interconnection between widely spaced logic elements.

FIG. 9 illustrates how the structure of FIG. 8 can be used to avoid hold time violations for near logic elements.

FIG. 10 illustrates how the structure of FIG. 8 can be used to avoid large setup requirements for an interconnection between widely spaced logic elements.

DETAILED DESCRIPTION OF THE DRAWINGS

The present invention is applicable to a variety of programmable logic devices (PLDs). An appreciation of the present invention is presented by way of specific examples utilizing field programmable gate arrays (FPGAs). However, the present invention is not limited by these examples, and can be applied to many different ICs that include programmable resources.

Figure 1:
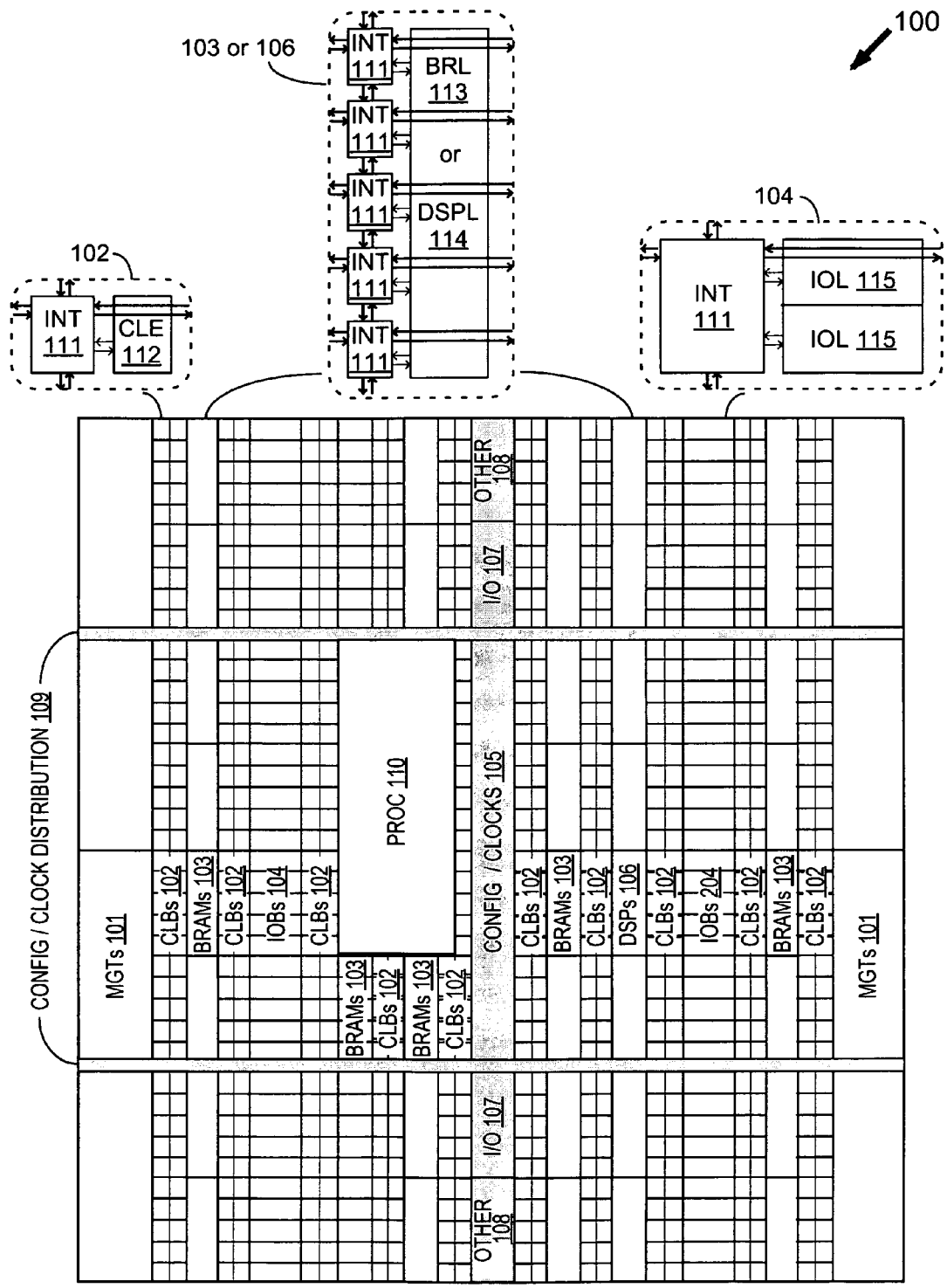
FIG. 1 illustrates an FPGA architecture that includes several different types of programmable logic blocks.

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
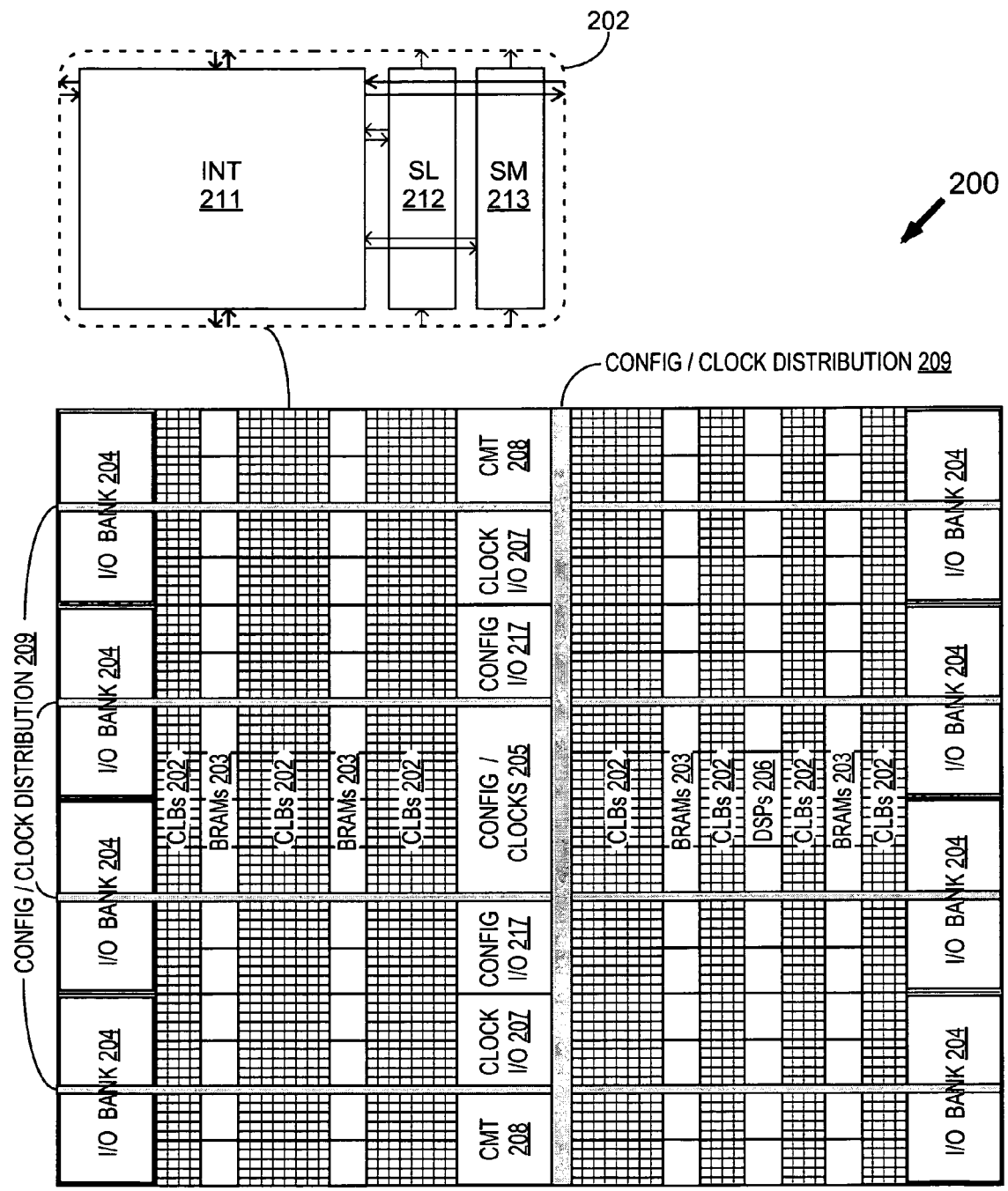
FIG. 2 illustrates another FPGA architecture that includes several different types of programmable logic blocks.

FIG. 2 illustrates an exemplary FPGA 200 utilizing the general architecture shown in FIG. 1. The FPGA of FIG. 2 includes CLBs 202, BRAMs 203, I/O blocks divided into "I/O Banks" 204 (each including 40 I/O pads and the accompanying logic), configuration and clocking logic 205, DSP blocks 206, clock I/O 207, clock management circuitry (CMT) 208, configuration I/O 217, and configuration and clock distribution areas 209.

In the FPGA of FIG. 2, an exemplary CLB 202 includes a single programmable interconnect element (INT 211) and two different "slices", slice L (SL 212) and slice M (SM 213). In some embodiments, the two slices are the same (e.g., two copies of slice L, or two copies of slice M). In other embodiments, the two slices have different capabilities. In some embodiments, some CLBs include two different slices and some CLBs include two similar slices. For example, in some embodiments some CLB columns include only CLBs with two different slices, while other CLB columns include only CLBs with two similar slices.

Figure 3:
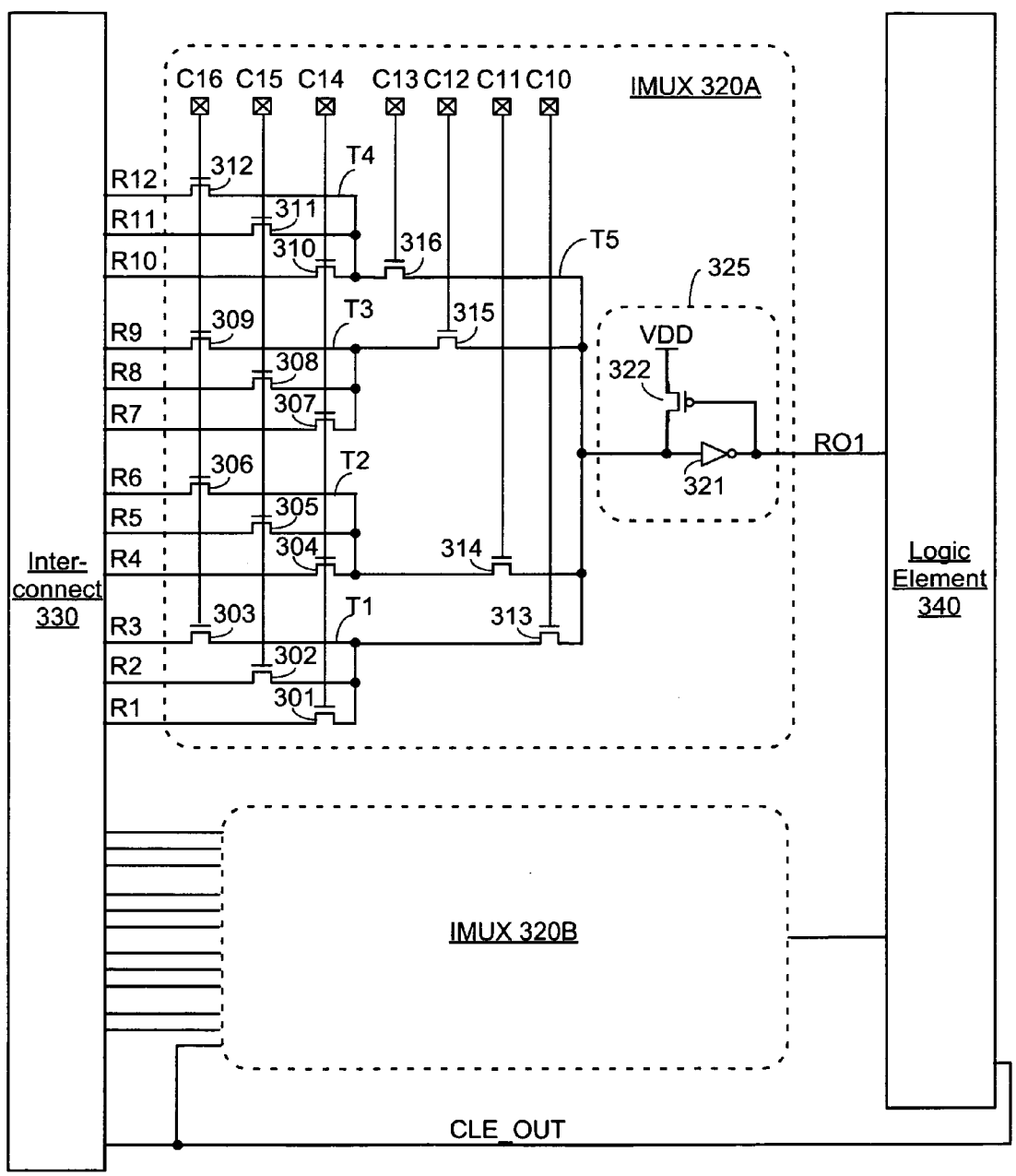
FIG. 3 illustrates how input multiplexers provide an interface between the programmable interconnect structure and a configurable logic element in an exemplary FPGA.

FIG. 3 illustrates how a programmable input multiplexer can be used to provide additional routing flexibility between the programmable interconnect structure and a configurable logic element (CLE) or other type of logic element, where the logic element can be programmable, non-programmable, or partially programmable. An input multiplexer provides the ability to select one of many different interconnect lines to provide a signal to a CLE input terminal. An input multiplexer can be implemented, for example, as shown in FIG. 3 (IMUX 320A). The illustrated circuit selects one of several different input signals and passes the selected signal to an output terminal. Note that FIG. 3 illustrates an input multiplexer with twelve inputs, but PLD input multiplexers typically have many more inputs, e.g., 20, 24, 28, 30, 36, or some other number. However, FIG. 3 illustrates a smaller circuit, for clarity.

The circuit of FIG. 3 includes twelve input terminals R1-R12 and sixteen pass gates 301-316. Pass gates 301-303 selectively pass one of input signals R1-R3, respectively, to a first internal node T1. Each pass gate 301-303 has a gate terminal driven by a configuration memory cell C14-C16, respectively. Similarly, pass gates 304-306 selectively pass one of input signals R4-R6, respectively, to a second internal node T2. Each pass gate 304-306 has a gate terminal driven by one of the same configuration memory cells C14-C16, respectively. From internal nodes T1, T2, pass gates 313, 314 are controlled by configuration memory cells C10, C11, respectively, to selectively pass at most one signal to another internal node T5.

Pass gates 307-312 and 315-316 are similarly controlled by configuration memory cells C12-C16 to select at most one of input signals R7-R12 and to pass the selected input signal via one of internal nodes T3, T4 to internal node T5, as shown in FIG. 3.

The signal on internal node T5 is buffered by buffer 325 to provide output signal RO1. Buffer 325 includes an inverter 321 and a pull-up (e.g., a P-channel transistor 322 to power high VDD) on internal node T5 and driven by the output of inverter 321.

Thus, values stored in configuration memory cells C10-C16 select at most one of the input signals R1-R12 to be passed to internal node T5, and hence to output node RO1. If none of the input signals is selected, output signal RO1 is held at its initial high value by pull-up 322.

One factor that must be taken into account when designing PLDs, and when implementing user designs in PLDs, is potential setup and hold time violations. A hold time requirement for a clocked element (e.g., a flip-flop, a latch, a register, a lookup table in RAM mode or shift register mode, or other clocked element) is the amount of time a signal must remain on the data input terminal after the clock signal is provided to the clock input terminal, in order to ensure that the correct data is clocked in. A setup time requirement is the amount of time by which an input data signal must precede the arrival of the clock signal at the clocked element. Setup and hold times must be taken into account when routing PLDs, because the path delays can cause setup and hold violations, as is now explained with reference to the examples shown in FIGS. 4-7.

FIG. 4 illustrates a typical interconnection between widely spaced logic elements in a known FPGA. A source logic element (e.g., LE 402) includes a clocked logic element (e.g., flip-flop 404). The clock signal for the clocked element is provided by clock tree 403. The output signal from logic element 402 is routed via the programmable interconnect structure and has a path delay (Pdelay) 406. The destination logic element 401 also includes a clocked logic element (e.g., flip-flop 405). However, in the pictured example, the clock signal at the input terminal of flip-flop 405 has a clock skew relative to the clock signal at the input terminal of flip-flop 404.

PLDs are typically designed to have a balanced clock tree, so that the clock skew between the various logic elements is minimal (e.g., substantially zero). For example, clocks can be distributed from the center of the PLD outward, to minimize the length of the clock distribution lines, and heavily loaded clock lines are typically buffered to compensate for the additional load. However, some logic elements (such as logic element 401, for example) can have significant clock delays within the logic element ("internal clock delays"). Therefore, large logic elements such as an Ethernet MAC interface, a PCI interface, or a Gigabit Transceiver often include clock skew relative to other logic elements, such as CLBs. Further, the process of implementing a user design in the PLD can introduce clock skews between different branches of the clock tree, e.g., by programmably adding more load to one branch than to another branch of the clock tree. Clock skew can also occur for other reasons.

In the example of FIG. 4, logic element 401 includes a clock skew relative to other logic elements such as logic element 402. However, the large path delay (Pdelay 406) on the data signal provides enough delay to prevent a hold time violation at the destination logic element. This case might occur, for example, when the source and destination logic elements are fairly far away from one another, e.g., far enough apart to cause a sufficiently large path delay.

For the signal path of FIG. 4, for example, the path delay 406 includes the clock-to-out delay of flip-flop 404 plus the routing delay. The total hold requirement at the destination includes the hold time of flip-flop 405 plus the clock skew 407. If the path delay 406 is larger than the total hold requirement at the destination, no hold violation will occur.

However, consider two logic elements that are close enough together that a signal path between the two logic elements has a small path delay, as shown in FIG. 5. FIG. 5 illustrates a situation in which the source logic element 502 (including flip-flop 504) is located near to the destination logic element 401. In this case, the path delay 506 between the two logic elements is relatively small, i.e., insufficient to prevent a hold time violation on the data signal at the destination logic element.

One known method of preventing this type of hold time violation is to insert additional delay on the data input of the flip-flop that is sufficient to compensate for the clock skew in the destination logic element. For example, one known solution is to deliberately route the data signals with hold time violations through unnecessarily long signal paths, potentially even inserting unnecessary lookup tables in the signal paths. Another known solution is to include a fixed delay on the data input paths of each logic element, as shown in FIG. 6.

In FIG. 6, destination logic element 601 includes a fixed delay (Fdelay 606) on the data input path to flip-flop 405. This delay is sufficient to counter the clock skew of the destination logic element (Cskew 407). When the source and destination logic elements are located close to one another, as shown in FIG. 6, the hold time problem is overcome.

However, the newly-inserted delay has now caused a different problem, as shown in FIG. 7. When the source and destination logic elements are located far enough away from one another, the path delay Pdelay once again becomes a factor. When the path delay is sufficiently large, a setup time violation will occur, unless a relatively slow clock signal is used. Hence, the insertion of the fixed delay in the signal path ensures that there will be no hold time violations, at the cost of a decrease in operating frequency for at least this portion of the user design.

Figure 8:
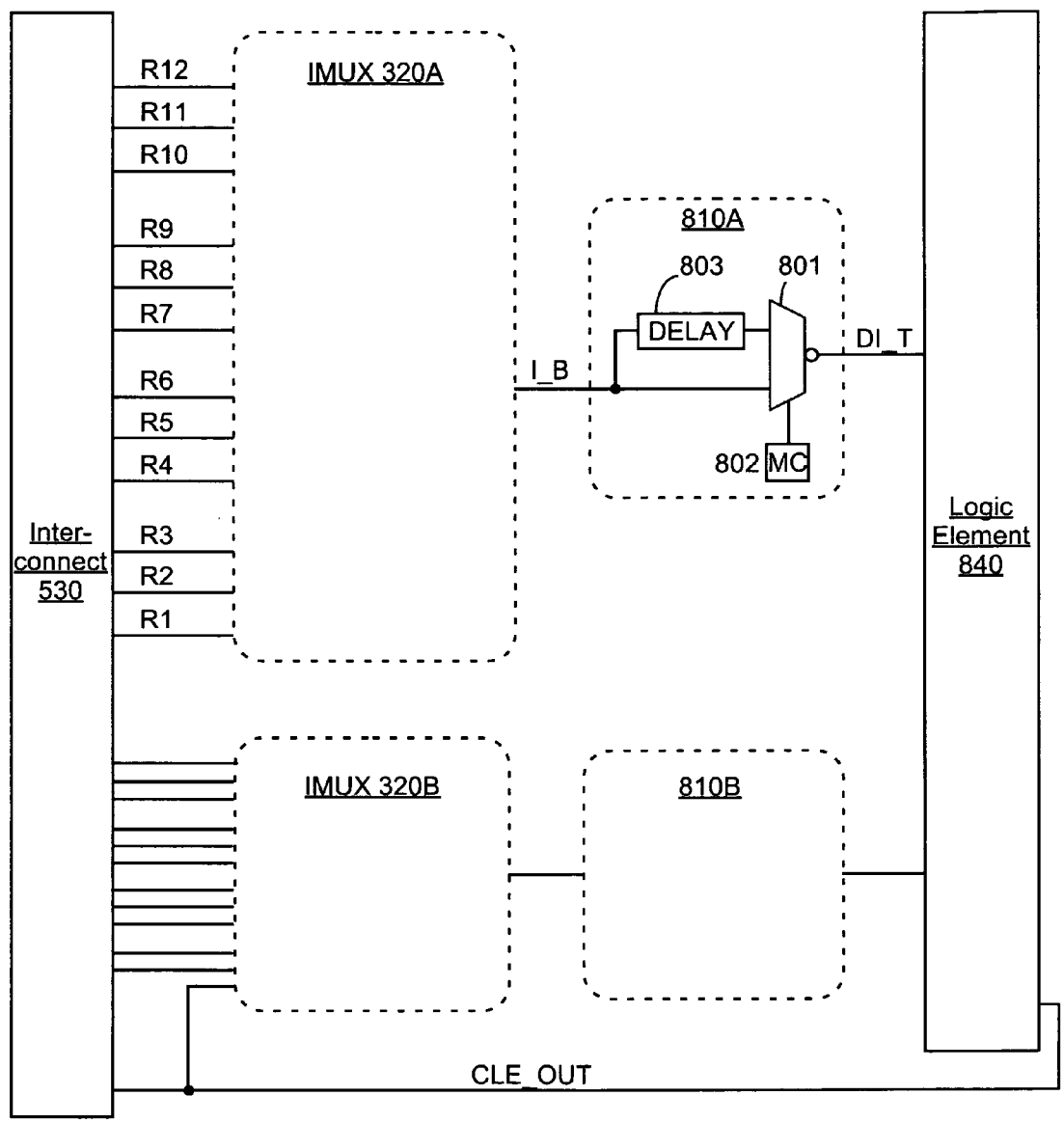
FIG. 8 illustrates how the structure of FIG. 3 can be altered to avoid hold time violations without imposing large setup requirements, by including an optional delay on the data input paths of logic elements having a relative clock skew.

FIG. 8 provides a solution to this dilemma. FIG. 8 illustrates how the structure of FIG. 3 can be altered to avoid hold time violations without imposing large setup requirements, by including an optional delay on the data input paths of logic elements having a relative clock skew. The structure of FIG. 8 is similar to the structure of FIG. 3, and similar elements are similarly numbered. However, in the embodiment of FIG. 8, optional delay elements (810A, 810B) have been added on the data input paths, between the input multiplexers (IMUXes 320A, 320B) and the logic element 840. Conceptually, each optional delay element includes a multiplexer 801, which is controlled by a value stored in a memory cell (MC 802) to select either the input signal I_B from the input multiplexer, or a delayed version of the input signal provided by delay element 803. In the pictured embodiment, the selected signal is inverted by the multiplexer 801, before being provided to the logic element 840. In some embodiments, the selected signal is not inverted.

In some embodiments, the optional delay element is only provided for some of the logic elements, e.g., the logic elements having the largest amounts of clock skew relative to other logic elements. In some of these embodiments, each data input to a logic element having a large clock skew includes a delay element having a standard amount of optional delay. In other words, the standard delay is the same for each data input to the logic element. However, different logic elements can have different standard delays, if desired, based on their respective clock skews. For other logic elements, there is no appreciable clock skew within the logic element, and the optional delay elements can be omitted without ill effects.

In some embodiments, the optional delay element is provided on only some of the input paths of the logic element, or different optional delay elements having different delays are provided for different input signals. For example, clock skew can vary within the logic element. Further, different data inputs can have different delays because of differences in the logic included in the input paths, for example. Therefore, in some embodiments each input signal driving a clocked element is provided with an optional delay element that optionally delays the input signal by an amount of time that depends on the clock skew for that particular input signal. Control signals for the clocked elements (e.g., clock enable signals, set/reset signals, and so forth) are not provided with the optional delay elements, in some embodiments.

Because the optional delay elements are only configured to insert the optional delay for fast signal paths, in some embodiments the optional delay element provides a larger delay than was provided by the fixed delays included in known logic elements. If desired, more margin can be provided in an optional delay element to fix a hold time violation than in the fixed delay solution, because when the added delay is optional, the added delay (including the margin) does not affect setup times for slow signal paths. When the delay is fixed, the added margin will always be present as a penalty added to the setup time.

In some embodiments, the optional delay element is only provided on some of the input paths of some of the logic elements.

Figure 11:
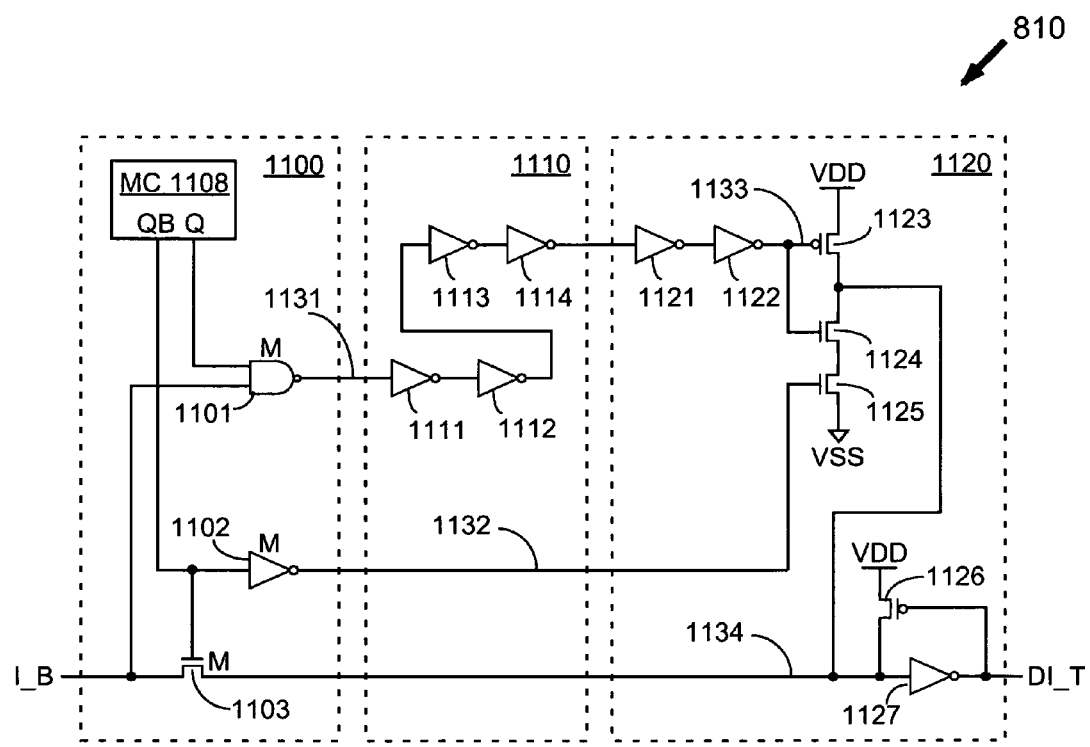
FIG. 11 illustrates an exemplary implementation of an optional delay element that can be used, for example, in the embodiment of FIGS. 8-10.

FIG. 9 illustrates how the structure of FIG. 8 can be used to avoid hold time violations for near logic elements. Logic element 901 includes a clocked element 905 and a clock skew (Cskew 907). Logic element 902 including clocked element 904 is located nearby, so there is only a small path delay (Pdelay 906) between the two logic elements. Both clocked elements 904 and 905 are clocked by the same clock tree 903. In this situation, an optional delay element (Odelay 906) is programmed to insert an optional delay on the signal path between the two logic elements, thereby ensuring that there is no hold time violation on the signal. Optional delay element 906 can be implemented, for example, as shown in FIG. 11. However, other implementations can also be used.

FIG. 10 illustrates how the structure of FIG. 8 can be used to avoid large setup requirements for an interconnection between widely spaced logic elements. In this example, logic element 1002 (which includes clocked element 1004) is located far away from logic element 901, so there is an appreciable path delay (Pdelay 1006) between the two logic elements. In the pictured example, the path delay is sufficient to avoid a hold time violation on the signal. In this situation, the optional delay element 906 is programmed to bypass the additional delay. Thus, there is no large setup time requirement on the signal, as would be the case if the optional delay were inserted on the signal path.

FIG. 11 illustrates an exemplary implementation of an optional delay element that can be used, for example, in the embodiment of FIGS. 8-10. The optional delay element of FIG. 11 is implemented as three separate pieces, a beginning portion, a middle portion, and an end portion. Additional delay can be added to the optional delay element simply by adding more copies of the middle portion of the circuit.

Note that FIG. 11 provides only one of many possible implementations of optional delay element 810. It will be apparent to those of skill in the art that many different implementations can be used, including (for example) the simple delay element and multiplexer shown in FIG. 8.

The beginning portion 1100 of optional delay element 810 includes a memory cell 1108, a NAND gate 1101, an inverter 1102, and an N-channel transistor 1103, coupled together as shown in FIG. 11. Memory cell 1108 can be, for example, a static RAM cell functioning as a configuration memory cell of a PLD. Thus, memory cell 1108 is programmed by one bit of a configuration bit stream, as part of the programming process for the PLD. In the pictured embodiment, both the Q (true) and the QB (complement) output values from memory cell 1108 are utilized in the circuit. Memory cell 1108 functions at a higher voltage level (VGG) than the other elements in the circuit, which function at the standard voltage level VDD. Therefore, signals Q and QB have a power high level of VGG.

Because of the power high level of VGG on their gate input signals, NAND gate 1101, inverter 1102, and N-channel transistor 1103 are implemented using a "mid-ox" oxide layer (indicated by the letter "M" next to the elements in the figure). This oxide layer is thicker than the standard oxide thickness used in elements 1111-1114 and 1121-1327, for example. The use of VGG (which requires the thicker oxide) increases the speed of N-channel transistor 1103 relative to standard pass-gates, which in turn reduces the path delay through optional delay element 810 when configured to bypass the optional delay.

The middle portion 1110 of optional delay element 810 includes a series of inverters 1111-1114, implementing a simple delay line. The end portion 1120 includes inverters 1121-1122 and 1127, P-channel transistors 1123 and 1126, and N-channel transistors 1124-1125, coupled together as shown in FIG. 11.

The circuit of FIG. 11 functions as follows. During the power-up sequence for the PLD that includes the circuit, memory cell output signals Q and QB are both low. Thus, transistor 1103 is turned off, and signals 1131, 1132, and 1133 are all high. Transistor 1123 is turned off and transistors 1124 and 1125 are both turned on, so signal 1134 is low. Hence, output signal DI_T (the inversion of signal 1134) is high.

After the PLD is powered up, but before the PLD is configured with a configuration bit stream, a zero value is stored in memory cell 1108. Thus, signal Q is low, and signal QB is high. Signals 1131 and 1133 remain high, because of the low value on the Q output of memory cell 1108. However, signal 1132 goes low, so the structure including transistors 1123-1125 is no longer driving signal 1134. N-channel transistor 1103 turns on, and the value on signal I_B is passed to inverter 1127, and hence in inverted form to the output terminal DI_T. The optional delay element is now functioning in the default mode of adding no additional delay, except the very small delay caused by transistor 1103 and inverter 1127. P-channel transistor 1126 serves to ensure that a valid high value is provided to the input terminal of inverter 1127.

If the PLD is subsequently configured with a zero value in memory cell 1108, the circuit continues to function as it did prior to configuration. However, if a high value is stored in memory cell 1108, the circuit functions in a different fashion. Signal Q is now high, and signal QB is low. N-channel transistor 1103 is turned off, so the value on input terminal I_B is not immediately passed on to inverter 1127. Instead, because signal Q is low, signal I_B is passed through NAND gate 1101 in inverted form. The inverted value appears again as signal 1133, is inverted again by the structure including transistors 1123-1125, and is passed to the input terminal of inverter 1127. The optional delay element is now functioning in the delay mode.

Note that the implementation shown in FIG. 11 has the advantage that when the optional delay element is in the bypass mode, the signals along the delay path do not change state. This feature improves the power consumption of the optional delay element when the optional delay is not in use.

In some embodiments (not shown), the optional delay element offers greater flexibility than the simple on/off option. For example, an optional delay element could include more than one memory cell, and the contents of the memory cells could be decoded to select between various amounts of delay. For example, an optional delay element with two memory cells could provide a selection among the options of no delay, a small delay, a somewhat larger delay, and a full delay.

Figure 12:
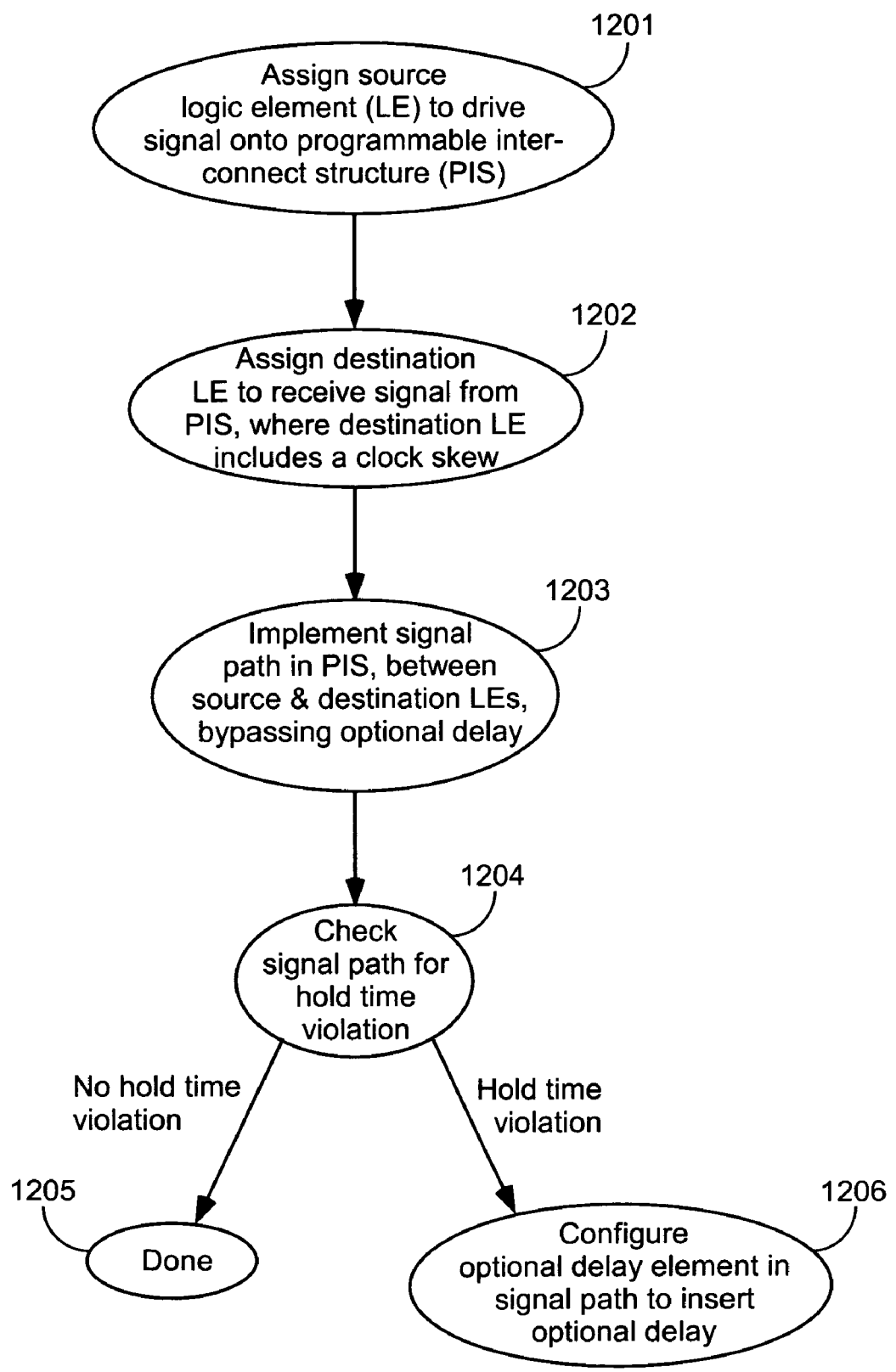
FIG. 12 illustrates the steps of a method of avoiding hold time violations in a PLD.

FIG. 12 illustrates the steps of a method of avoiding hold time violations in a PLD. These steps can be performed, for example, by implementation software for a user design in the PLD, e.g., by placement and routing software or by software that runs after the placement and routing processes are complete.

In step 1201, a source logic element (LE) is assigned to drive a signal onto a programmable interconnect structure (PIS) of the PLD. For example, the first logic element can be a programmable logic element such as a configurable logic block (CLB) of a PLD, or can be some other type of logic element, whether programmable, non-programmable, or partially programmable. In step 1202, a destination logic element is assigned to receive the signal from the source logic element, where the destination logic element includes a clock skew relative to the source logic element. Steps 1201 and 1202 can be performed, for example, by standard placement software for PLDs.

In step 1203, a signal path is implemented between the source and destination logic elements, utilizing the programmable interconnect structure. This step might include, for example, configuring an input multiplexer in the destination logic element to select the signal from the interconnect structure and pass the signal to a clocked element in the destination logic element. This step includes configuring an optional delay element to bypass an optional delay. In some embodiments, the optional delay is sufficiently large to overcome a hold time violation for a maximum value of the clock skew and a minimum delay in the signal path. This step might be performed, for example, by standard routing software modified to bypass the optional delay element. In some embodiments, the optional delay element and/or the routing software are designed to bypass the optional delay as a default condition.

In step 1204, the signal path is checked for a hold time violation at the destination logic element. If no hold time violation is found (step 1205), the signal path is complete. In some embodiments, the software continues on to repeat the routing process for the next signal path. In other embodiments, all signal paths are routed first, then all signal paths (or all signal paths terminating in logic elements with a relative clock skew) are checked for hold time violations. In these embodiments, when no hold time violations are found the routing step is considered to be complete.

If a hold time violation is found on the signal path in step 1204, the optional delay element is configured to insert the optional delay on the signal path between the programmable interconnect structure and the destination logic element (step 1206). Steps 1204 and 1206 can be performed, for example, by the routing software, or by hold-time-improvement software different from the routing software that runs after the design is fully routed.

Because the optional delay is only inserted when needed to overcome a hold time violation, signal paths not having hold time violations are not penalized by the imposition of excessive setup time requirements.

Figure 13:
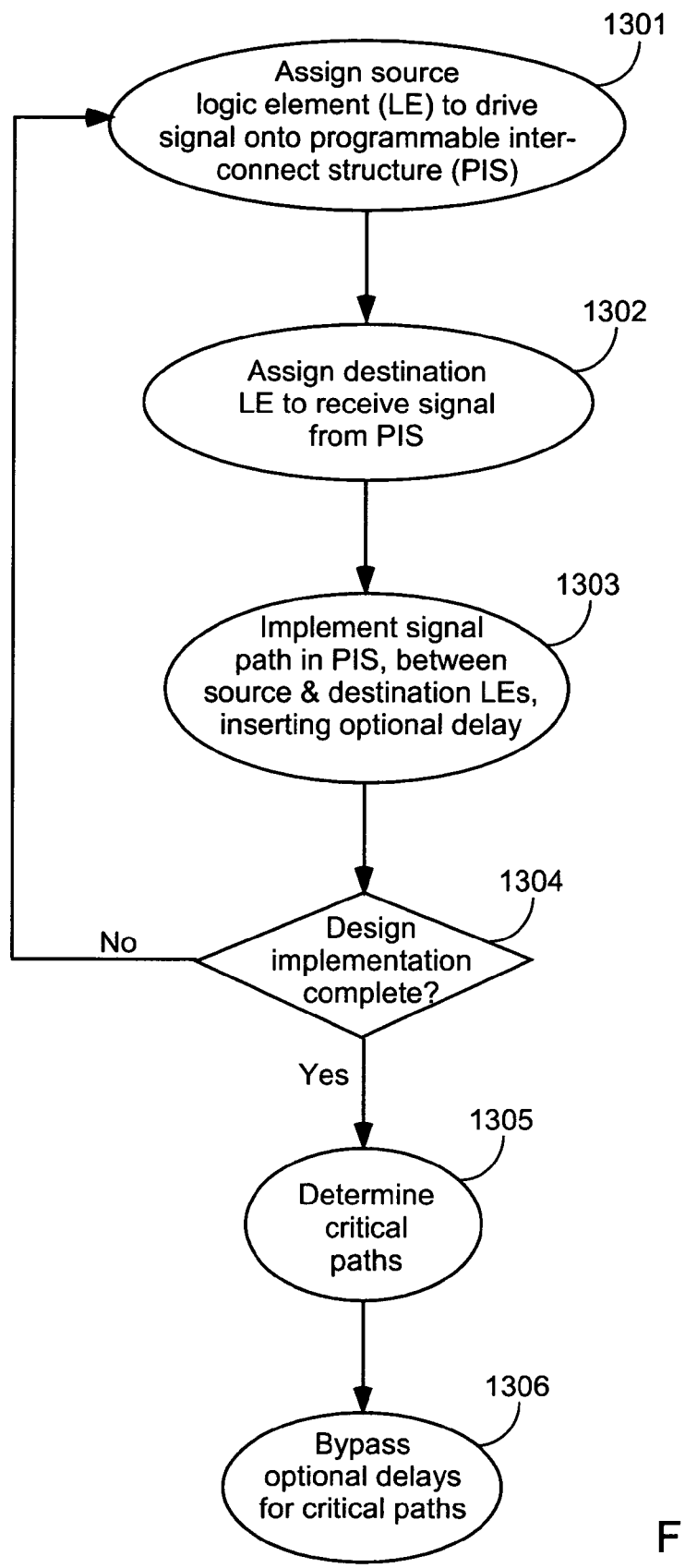
FIG. 13 illustrates the steps of a method of implementing a user design in a PLD while avoiding hold time violations.

FIG. 13 illustrates the steps of a method of implementing a user design in a PLD while avoiding hold time violations. In steps 1301-1304, the user design is implemented. In step 1301, a source logic element (LE) is assigned to drive a signal onto a programmable interconnect structure (PIS) of the PLD. For example, the first logic element can be a programmable logic element such as a configurable logic block (CLB) of a PLD, or can be some other type of logic element, whether programmable, non-programmable, or partially programmable. In step 1302, a destination logic element is assigned to receive the signal from the source logic element. Steps 1301 and 1302 can be performed, for example, by standard placement software for PLDs.

In step 1303, a signal path is implemented between the source and destination logic elements, utilizing the programmable interconnect structure. This step might include, for example, configuring an input multiplexer in the destination logic element to select the signal from the interconnect structure and pass the signal to a clocked element in the destination logic element. This step includes configuring an optional delay element to insert an optional delay. In some embodiments, the destination logic element has a clock skew relative to the source logic element, and the optional delay is sufficiently large to overcome a hold time violation for a maximum value of the clock skew and a minimum delay in the signal path. This step might be performed, for example, by standard routing software modified to insert the optional delay element. In some embodiments, the optional delay element and/or the routing software are designed to insert the optional delay as a default condition.

Decision step 1304 controls the design implementation process by repeating steps 1301-1303 until the design implementation is complete.

In step 1305, implemented design is evaluated to determine the critical paths. The critical paths are the signal paths that determine the maximum operating frequency for the user design. In step 1306, the implemented design is modified by reconfiguring the optional delay elements in each of the critical paths to bypass the optional delay.

Those having skill in the relevant arts of the invention will now perceive various modifications and additions that can be made as a result of the disclosure herein. For example, the above text describes the circuits and methods of the invention in the context of programmable logic devices (PLDs) such as field programmable gate arrays (FPGAs). However, the circuits of the invention can also be implemented in other programmable devices.

Further, logic elements, configurable logic elements, programmable interconnect structures, clocked elements, flip-flops, memory cells, configuration memory cells, inverters, NAND gates, NOR gates, transistors, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. An integrated circuit (IC), comprising:
a programmable interconnect structure;
a plurality of input multiplexers having input terminals coupled to the programmable interconnect structure;
a first logic element having a plurality of input terminals and further having an output terminal coupled to the programmable interconnect structure; and
a plurality of optional delay elements, each of the optional delay elements having an input terminal coupled to the output terminal of a corresponding one of the input multiplexers, each of the optional delay elements further having an output terminal coupled to a corresponding one of the input terminals of the first logic element,
wherein the first logic element comprises a clock skew relative to other logic elements in the IC, and wherein each of the optional delay elements comprises an optional delay sufficiently large to overcome a hold-time violation caused by the clock skew.

2. The IC of claim 1, wherein the first logic element comprises a programmable logic element.

3. An integrated circuit (IC), comprising:
a programmable interconnect structure;
a plurality of input multiplexers having input terminals coupled to the programmable interconnect structure;
a first logic element having a plurality of input terminals and further having an output terminal coupled to the programmable interconnect structure;
a plurality of optional delay elements, reach of the optional delay elements having an input terminal coupled to the output terminal of a corresponding one of the input multiplexers, each of the optional delay elements further having an output terminal coupled to a corresponding one of the input terminals of the first logic element;
a clock tree coupled to the first logic element; and
a second logic element coupled to the programmable interconnect structure and to the clock tree,
wherein the first logic element comprises a first clocked element comprising a clock skew relative to a second clocked element included in the second logic element.

4. The IC of claim 3, further comprising a second plurality of input multiplexers coupled between the programmable interconnect structure and input terminals of the second logic element, whereby a programmable connection is formed between the programmable interconnect structure and the second logic element that does not traverse an optional delay element.

5. An integrated circuit (IC), comprising:
a programmable interconnect structure;
a plurality of input multiplexers having input terminals coupled to the programmable interconnect structure;
a first logic element having a plurality of input terminals and further having an output terminal coupled to the programmable interconnect structure; and
a plurality of optional delay elements, each of the optional delay elements having an input terminal coupled to the output terminal of a corresponding one of the input multiplexers, each of the optional delay elements further having an output terminal coupled to a corresponding one of the input terminals of the first logic element,
wherein for each of the optional delay elements:
the optional delay element comprises a delay path and a bypass path;
in a first mode a signal on the input terminal of the optional delay element traverses the delay path; and
in a second mode the signal on the input terminal of the optional delay element traverses the bypass path, and signals on the delay path do not change state.

6. The IC of claim 1, wherein each of the optional delay elements comprises a memory cell.

7. The IC of claim 1, wherein the IC comprises a programmable logic device (PLD), and wherein each of the optional delay elements comprises a configuration memory cell of the PLD.

8. An integrated circuit (IC), comprising:
   a programmable interconnect structure;
   a plurality of input multiplexers having input terminals coupled to the programmable interconnect structure;
   a first logic element having a plurality of input terminals and further having an output terminal coupled to the programmable interconnect structure, wherein the first logic element comprises a first internal clock delay;
   a plurality of optional delay elements, each of the optional delay elements having an input terminal coupled to the output terminal of a corresponding one of the input multiplexers, each of the optional delay elements further having an output terminal coupled to a corresponding one of the input terminals of the first logic element; and
   a second logic element having a plurality of input terminals coupled to the programmable interconnect structure and further having an output terminal coupled to the programmable interconnect structure, the second logic element comprising a second internal clock delay smaller than the first internal clock delay.

* * * * *